United States Patent
Thevenet

(10) Patent No.: US 7,319,359 B2
(45) Date of Patent: Jan. 15, 2008

(54) HIGH CURRENT CHARGE PUMP FOR INTELLIGENT POWER SWITCH DRIVE

(75) Inventor: Kevin M. Thevenet, La Roque d'Antheron (FR)

(73) Assignee: International Rectifier Corporation, El Segundo, CA (US)

( * ) Notice: Subject to any disclaimer, the term of this patent is extended or adjusted under 35 U.S.C. 154(b) by 186 days.

(21) Appl. No.: 11/130,881

(22) Filed: May 17, 2005

(65) Prior Publication Data

US 2006/0001457 A1    Jan. 5, 2006

Related U.S. Application Data

(60) Provisional application No. 60/572,147, filed on May 17, 2004.

(51) Int. Cl.
*G05F 1/10* (2006.01)

(52) U.S. Cl. ..................... 327/540; 327/108
(58) Field of Classification Search ............... 327/538, 327/540, 541, 543, 108
See application file for complete search history.

(56) References Cited

U.S. PATENT DOCUMENTS

| | | | |
|---|---|---|---|
| 5,949,249 A * | 9/1999 | Preuss et al. | 326/27 |
| 6,392,472 B1 * | 5/2002 | Kobayashi et al. | 327/541 |
| 2002/0014914 A1* | 2/2002 | Perque et al. | 327/543 |

* cited by examiner

*Primary Examiner*—Quan Tra
(74) *Attorney, Agent, or Firm*—Ostrolenk, Faber, Gerb & Soffen, LLP

(57) ABSTRACT

A current limiting driver circuit for a semiconductor power switch and a switching device including same. The driver circuit includes a sensing circuit for providing a signal representing the current flowing through the semiconductor power switch, a driver circuit for the power switch, a driver circuit for the sensing circuit, and a comparator circuit having a first input provided by an output of the sensing circuit, a second input provided by a reference signal, and an output provided as a signal input for the first and second driver circuits. A first charge pump provides the supply voltage for the driver circuits, and a second charge pump provides the supply voltage for the comparator, which is higher than the supply voltage for the power switch and the sensing circuit, so that the first and second driver circuits limit the current through the power switch and the sensing circuit even when the output of the sensing circuit approaches the value of the reference signal.

11 Claims, 16 Drawing Sheets

HIGH CURRENT CHARGE PUMP FOR INTELLIGENT POWER SWITCH DRIVE

CROSS-REFERENCE TO RELATED APPLICATION

This application is based on and claims priority to U.S. Provisional Application 60/572,147, filed May 17, 2004, the entire disclosure of which is incorporated herein by reference.

BACKGROUND OF THE INVENTION

1. Technical Field of the Invention

The present invention relates to driver circuits for semiconductor power switching devices, and particularly to power switch controllers or drivers having improved current limiting protection for the switches.

2. Relevant Art

High power semiconductor switches, typically MOSFETS, are employed in high current power supplies, motor drives, and other applications. In such equipment, the switches are gated on and off by driver circuits. The driver circuits also include sensing and protective circuits for the power switches, and are often referred to as "intelligent".

The driver circuits often require voltages higher than the supply voltage, and a conventional way of providing these voltages is by use of a so-called charge pump. Broadly stated, as known by those skilled in the art, a charge pump operates by effectively transferring charge built-up on a first capacitor to a second capacitor. In addition, current limiting circuits are utilized to limit the current through the power switch.

FIG. 15 shows an example of a driver-current limiter circuit according to conventional practice, generally designated at 18. Here, op-amps 20 and 22 respectively provide gate control signals for a power MOSFET switch 24 and a sensing MOSFET 26. These may be combined as a MOSFET device including switch 24 as a current carrying cell and switch 26 as a sensing cell. A comparator op-amp 28 receives a reference voltage $V_{REF}$ at a direct input, and a current sense signal across a resistor 30 connected between the source terminal of MOSFET 26 and the source voltage $V_{SS}$ at its inverting input. An operating voltage $V_{CP}$ for op-amps 20 and 22 is provided by a single charge pump (not shown), while op-amp 28 is connected in common with MOSFETS 24 and 26 to a supply voltage $V_{DD}$.

In the illustrated circuit, as long as the source of switch 26 is at least about 1.5 volts below the drain voltage $V_{DD}$, current limiting is provided by comparator op-amp 28. However, when the drain-source voltage is less than approximately 1.5 volts, current limiting is not operative, and significant current overshoots beyond the desired current limit are possible. The reason for this is that op-amp 28 cannot operate as the output voltage nears the supply voltage $V_{DD}$.

FIG. 16 shows the relationship between $V_{DS}$ and the MOSFET output current, and the current limit $I_{LIM}$ determined by $V_{DS}/R_{DS-ON}$. As may be seen, when $V_{DS}$ is below 1.5 volts, an overshoot (shown at 32) occurs and the current exceeds the current limit $I_{LIM}$. When $V_{DS}$ equals or exceeds about 1.5 volts, the current limiting operates to clamp the current level to $I_{LIM}$.

In the past, the $R_{DS-ON}$ of the typical MOSFET was in 150 milliohm range, and the current limits were adequate to make the overshoots tolerable. However, the newer generation of power FETS exhibit $R_{DS-ON}$ approximately one-tenth the former level, e.g., approximately 13 milliohms, and the peak currents can be significantly higher.

This may also be seen in FIG. 16. Since the resistance $R_{DS-ON}$ is inversely related to the slope, if the slope increases, corresponding to lower $R_{DS-ON}$, the amount of overshoot below a $V_{DS}$ of about 1.5 volts can increase significantly, as shown by the dashed lines. Thus, a need clearly exists to provide a circuit architecture which ensures that current limiting occurs at $V_{DS}$ voltages below about 1.5 volts. The present invention is intended to meet this need.

SUMMARY OF THE INVENTION

According to the invention, the circuit of FIG. 15 is modified so that a first charge pump provides the supply voltage to the MOSFET gate drivers 20 and 22, and a second charge pump provides the supply voltage to the comparator op-amp 28. Since a charge pump can provide an output voltage which exceeds the charge pump supply voltage, i.e., $V_{DD}$ in the case of the circuit of FIG. 15, the supply voltage to op-amp comparator 28 can be raised above the MOSFET operating voltage. Now, the output voltage of comparator op-amp 28 does not have to approach the supply voltage $V_{DD}$, and the fact that the $V_{DS}$ of the MOSFETS may fall below the 1.5 volt limit, does not prevent the comparator op-amp, and thus the limiting circuit from operating.

It is accordingly an object of the present invention to provide an improved driver circuit for semiconductor power switching devices.

It is a further object of the invention to provide such an improved driver circuit in which current overshoot in the switching devices can be maintained at a desired level even when the voltage across the current path of the switch in the ON state is very small.

It is a more particular object of the invention to provide such an improved driver circuit for power MOSFETS in which the drain-source current overshoot can be maintained at a desired level even when the voltage across the MOSFET in the ON state is very small.

According to one aspect of the invention, there is provided a semiconductor switching device including a power-carrying cell, a current sense cell, drivers for each cell, a comparator circuit which provides a signal voltage for the drivers responsive to a reference signal and to a current sense signal provided by the current sense cell, in which the supply voltage for the drivers is provided by a first charge pump, and the supply voltage for the comparator circuit is provided by a second charge pump.

Further according to the first aspect of the invention, the supply voltage for the comparator circuit sufficiently exceeds the supply voltage for the switching devices to ensure that currently limiting is provided even for small values of the voltage across the switching devices in the ON state.

According to a second aspect of the invention, there is provided a MOSFET power switching device including a MOSFET power-carrying cell, a MOSFET current sense cell, drivers for each cell, a current limiting control circuit for the drivers responsive to a reference signal and a current sense signal provided by the MOSFET current sense cell, in which the supply voltage for the drivers is provided by a first charge pump, and the supply voltage for the current limiting control circuit is provided by a second charge pump.

Further according to the second aspect of the invention, the supply voltage for the current limiting control circuit sufficiently exceeds the supply voltage for the MOSFETS to ensure that currently limiting is provided even for small values of the drain-source voltage across the MOSFETS in the ON state.

Other features and advantages of the present invention will become apparent from the following description of the invention which refers to the accompanying drawings.

BRIEF DESCRIPTION OF THE DRAWINGS

Throughout the drawings, like parts are designated by the same reference numbers.

DETAILED DESCRIPTION OF THE INVENTION

Figure 1:
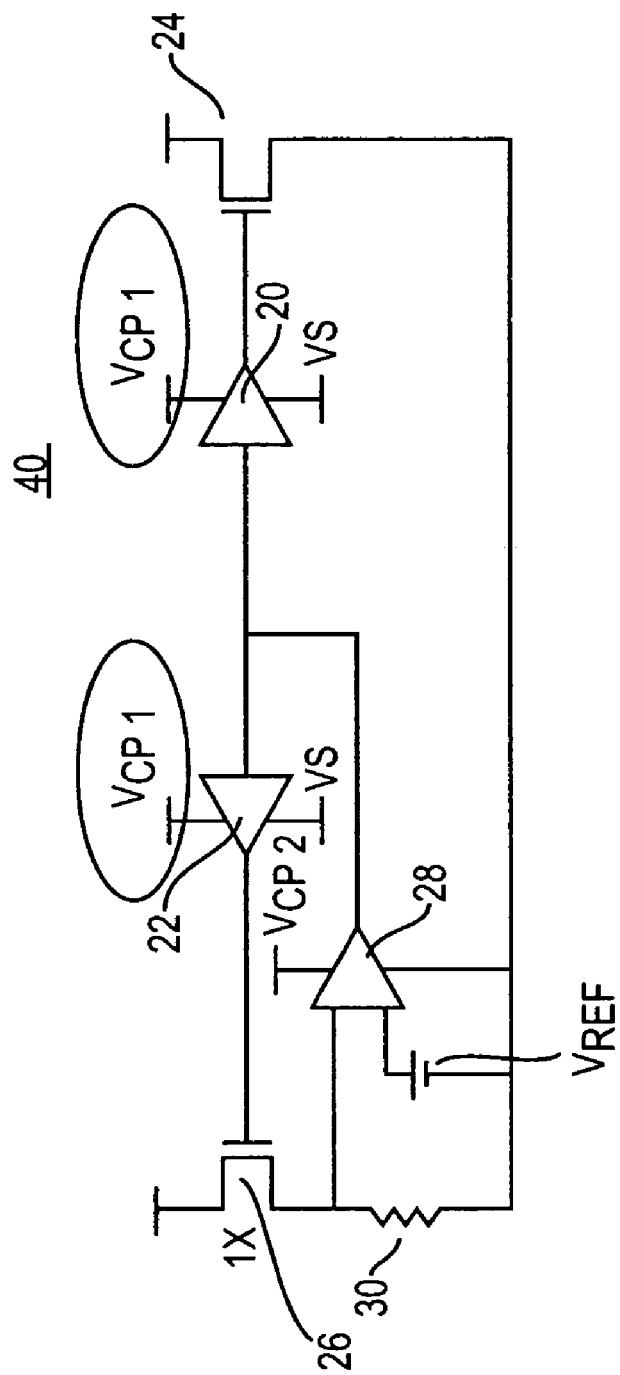
FIG. 1 shows in schematic form, the basic principle of the switch driver according to the invention.

Referring now to FIG. 1, a driver-current limiter according to the concept of the invention, generally designated at 40, is comprised of first and second gate drive op-amps 20 and 22 which respectively provide gate control signals for a power MOSFET switch 24 and a sensing MOSFET 26. These may respectively be a MOSFET power carrying cell and a MOSFET sensing cell. A comparator op-amp 28 has its output coupled in common as a signal input for gate drive op-amps 20 and 22. Comparator op-amp 28 receives a reference voltage $V_{REF}$ at a direct input, and a current sense signal across a resistor 30 connected between the source terminal of MOSFET 26 and the source voltage $V_{SS}$ at its inverting input. An operating (supply) voltage $V_{CP}$ for op-amps 20 and 22 is provided by a first charge pump (not shown).

Figure 15:
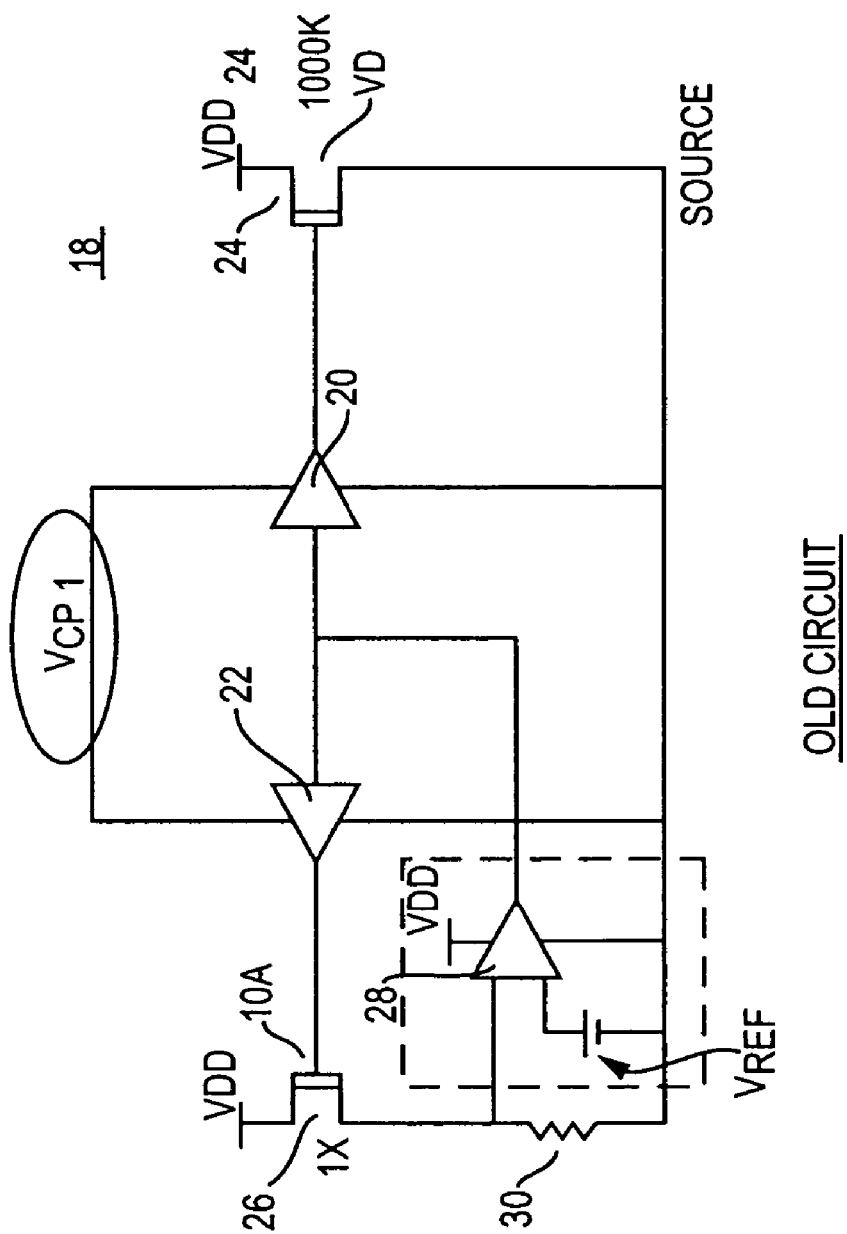
FIG. 15 is a schematic diagram illustrating a switch driver-limit circuit of the prior art.
Figure 16:
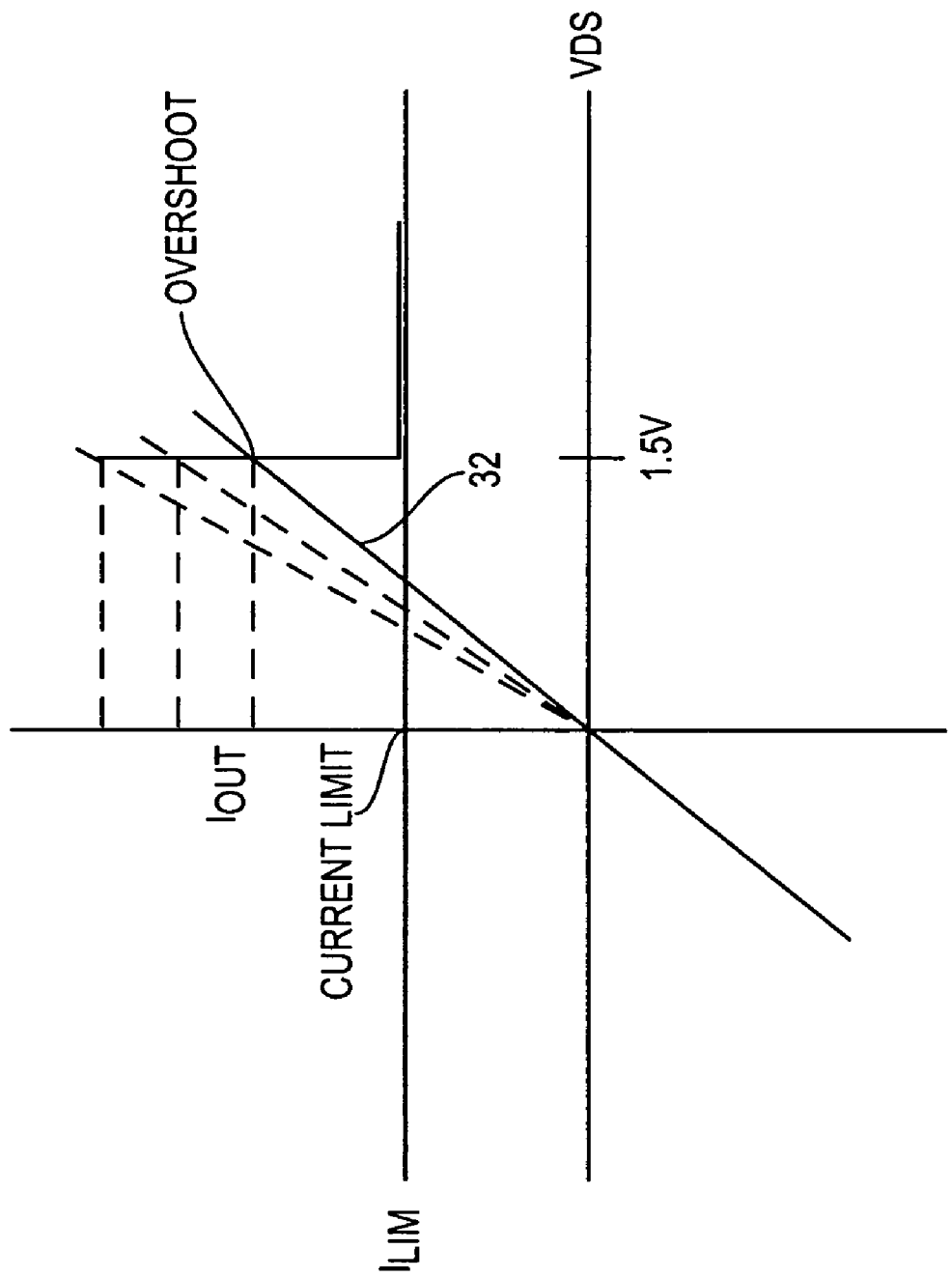
FIG. 16 illustrates the relationship between switch current and the drain-source voltage of the circuit shown in FIG. 15.

In the prior art, as illustrated in FIG. 15, the supply voltage for comparator op-amp 28 is provided by the drain supply voltage $V_{DD}$ for MOSFETS 24 and 26. According to the invention, however, the supply voltage $V_{CP2}$ for comparator op-amp 28 is provided by a second charge pump (not shown in FIG. 1, but illustrated in FIGS. 2, 4, and 5, and described more fully below).

In the illustrated circuit, comparator op-amp 28 still cannot operate as its output voltage nears its supply voltage, but with the supply voltage provided by the charge pump instead of the MOSFET drain voltage $V_{DD}$, the problem no longer exists. The charge pump voltage $V_{CP2}$ can be made sufficiently higher that than $V_{DD}$ that comparator op-amp 28 will always operate, irrespective of the drain-source voltage of switch 26.

As a consequence of the new design, significant overshoots beyond the desired current limit can be prevented because the current limiting function of comparator op-amp 28 is always available. Thus, as the currents through MOSFETS 24 and 26 increase, the voltage across sensing resistor 30 also increases. If this voltage approaches the reference level $V_{REF}$, the output of op-amp 28, becomes very small, and the signal voltage for driver op-amps 20 and 22 is effectively lowered. This, in turn, limits the gate current to MOSFETS 24 and 26.

An actual preferred implementation of the principles of the invention as described above is illustrated in FIGS. 2-14. This implementation is shown in integrated circuit (IC) form, but it is to be understood that the same implementation can be achieved using discrete circuit elements.

Moreover, it is to be understood that the embodiment shown is intended to be exemplary only, and that any other suitable or desired implementation, whether in IC or discrete form, is also within the scope of the invention.

Figure 2:
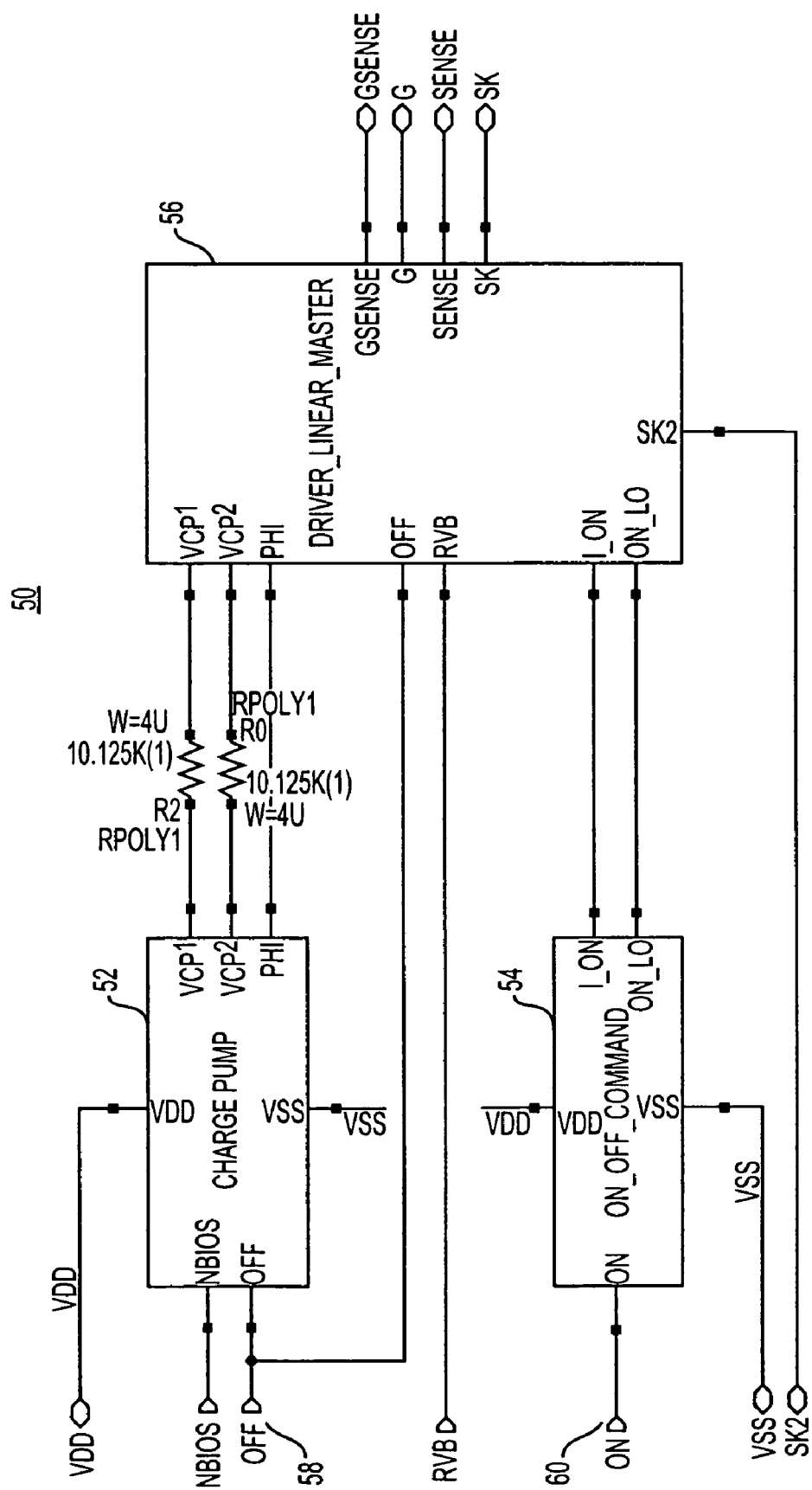
FIG. 2 is a functional illustration of an exemplary integrated circuit implementation of the concepts of the invention.

Turning now to FIG. 2, an overall gate drive/current limiting circuit embodying the principles of the invention is shown at 50. As will be understood by those skilled in the art, power supplies and motor drives are commonly constructed with high side and low side power MOSFETS, with level shifting circuits as needed between the two sides. The application of the principles of this invention, however, are the same on the high and low sides, and therefore, in the interest of simplicity, only the high side driver is illustrated.

As shown, circuit 50 is comprised of a charge pump section 52, an on/off command section 54, and a driver-linear master section 56. ON and OFF control signals are provided at terminals 58 and 60 from external logic circuitry (not shown), which is not part of the present invention. Further details of circuit 50 are shown in FIGS. 3-14.

Figure 3:
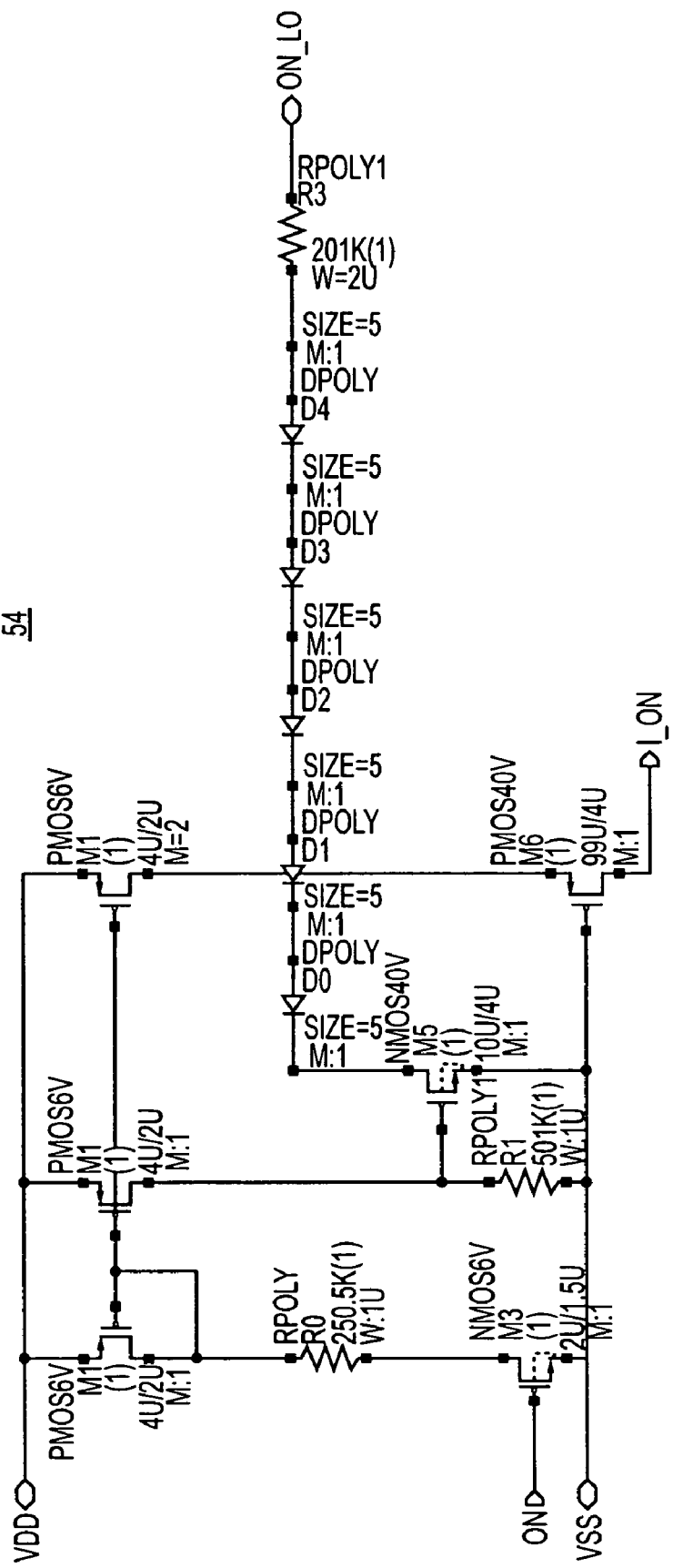
FIG. 3 is a circuit diagram for the on/off command shown in FIG. 2.

FIG. 3 shows a circuit diagram for the on/off command section 54 shown in FIG. 2. As the details of this circuit are not considered to be part of the invention, and should be readily apparent to those skilled in the art, a detailed description is omitted in the interest of brevity.

Figure 4:
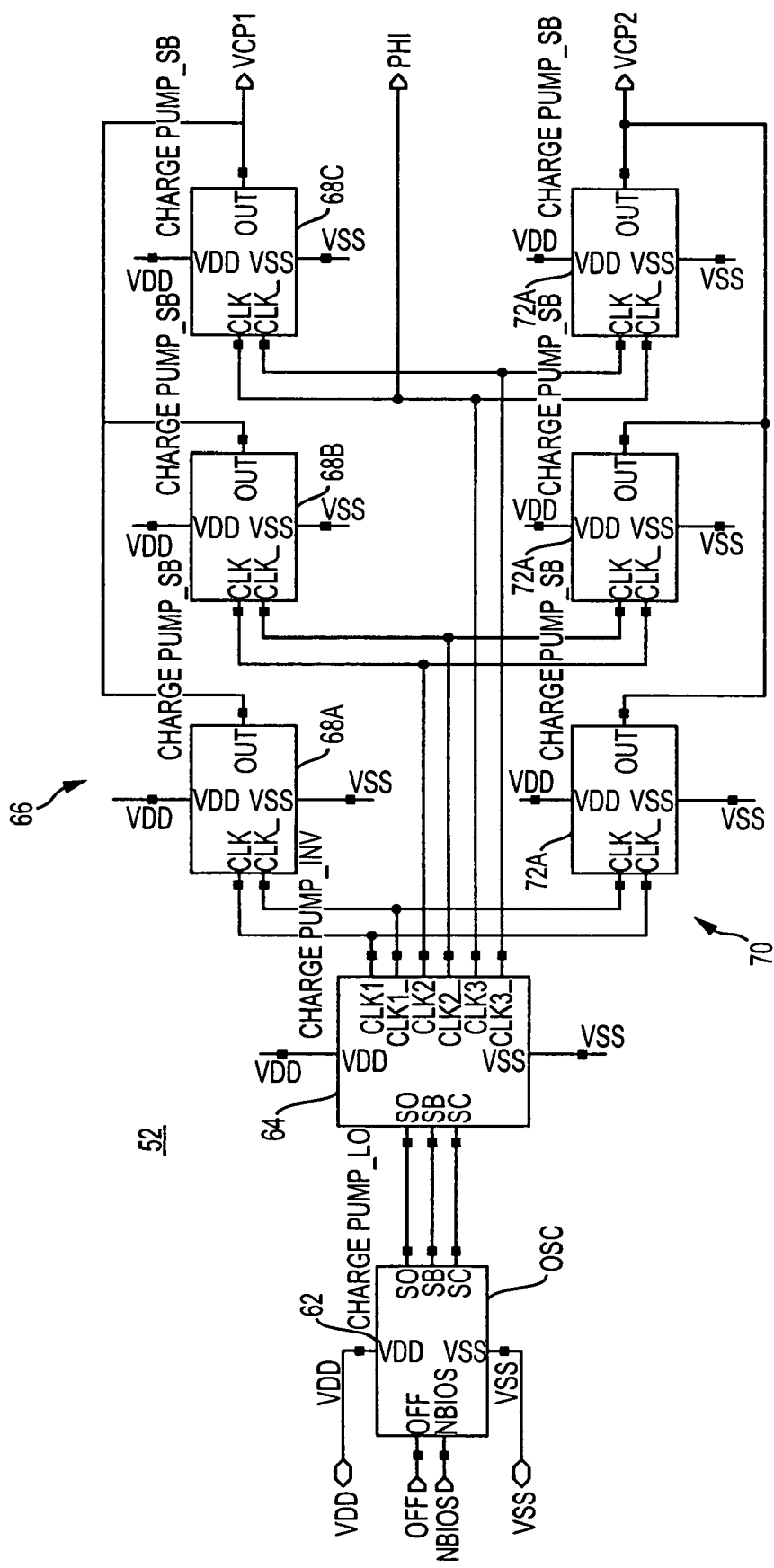
FIG. 4 is a circuit diagram for the charge pump of FIG. 2.

FIG. 4 shows a block diagram of charge pump section 52. This includes an oscillator 62, a charge pump inverter 64, an six charge pumps, divided into a first stage 66 including three individual charge pump phases 68*a*-68*c*, and a second stage 70 including three individual charge pump phases 72*a*-72*c*. First stage 66 provides the supply voltage $V_{CP1}$ for gate drive op-amps 20 and 22, while stage 70 provides the supply voltage $V_{CP2}$ for comparator op-amp 28 (see FIG. 1). The charge pumps are designed so that the upper and lower charge pumps are of opposite phase. The outputs of charge pump phases 68a-68c are tied together to provide the charge pump output $V_{CP1}$, and the outputs of charge pump phases 72a-72c are tied together to provide the charge pump output $V_{CP2}$.

Figure 5:
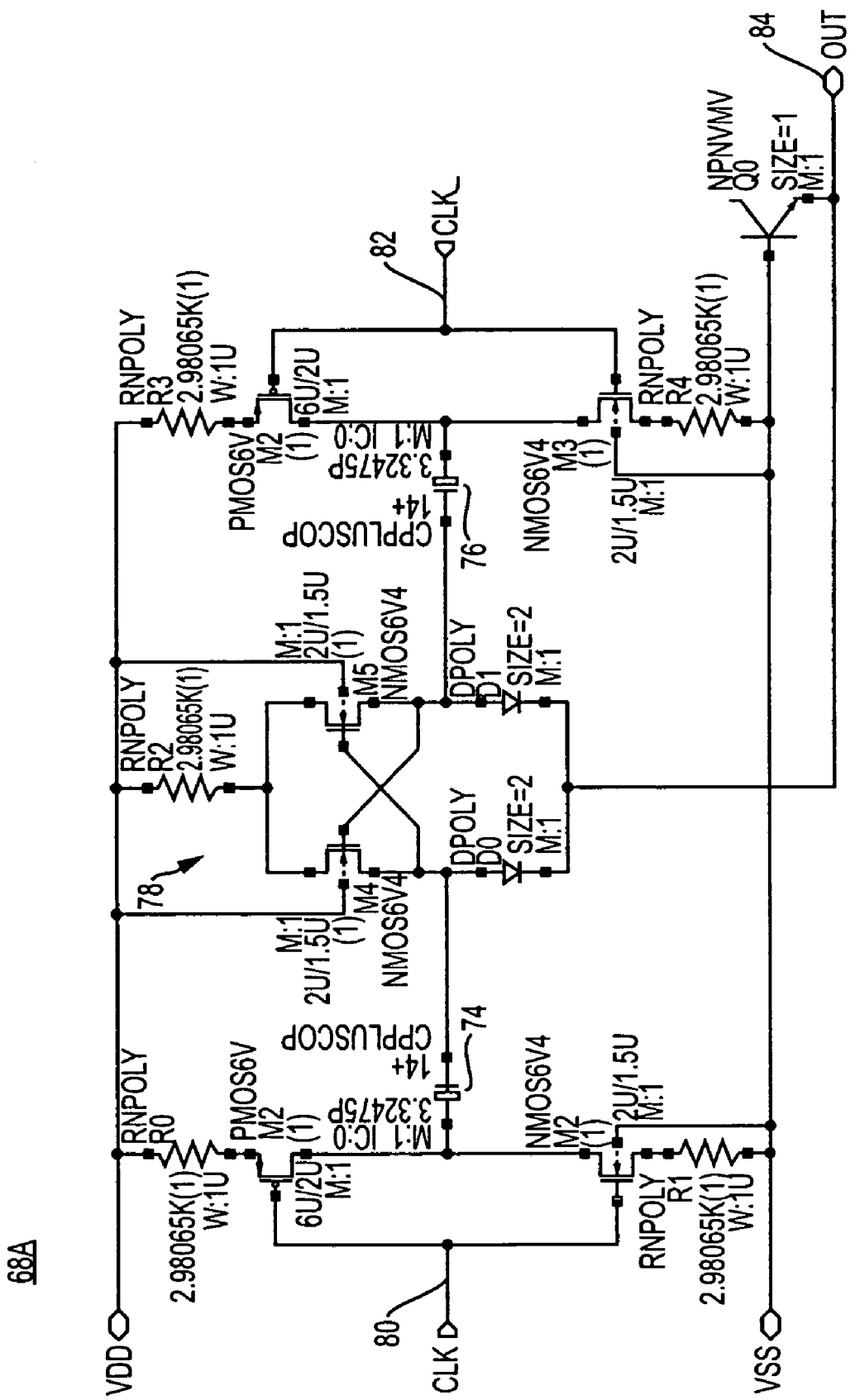
FIG. 5 illustrates the details of one section of the charge pump shown in FIG. 4.

A suitable preferred implementation of one of the six charge pump phases, e.g., 68a, is shown in FIG. 5. This includes a pair of capacitors 74 and 76, a bistable circuit 78, and other required circuit elements. Clock inputs for driving the bistable circuit 78 are provided at terminals 80 and 82, and the phase output is provided at terminal 84. As the specific implementation of the charge pump stages is not considered to be part of the invention, and the operation thereof is such that it will be readily understood by those skilled in the art, further details will be omitted in the interest of brevity.

It should also be understood that while the implementation shown a preferred one, any other desired or suitable charge pump circuit may be substituted.

Figure 6:
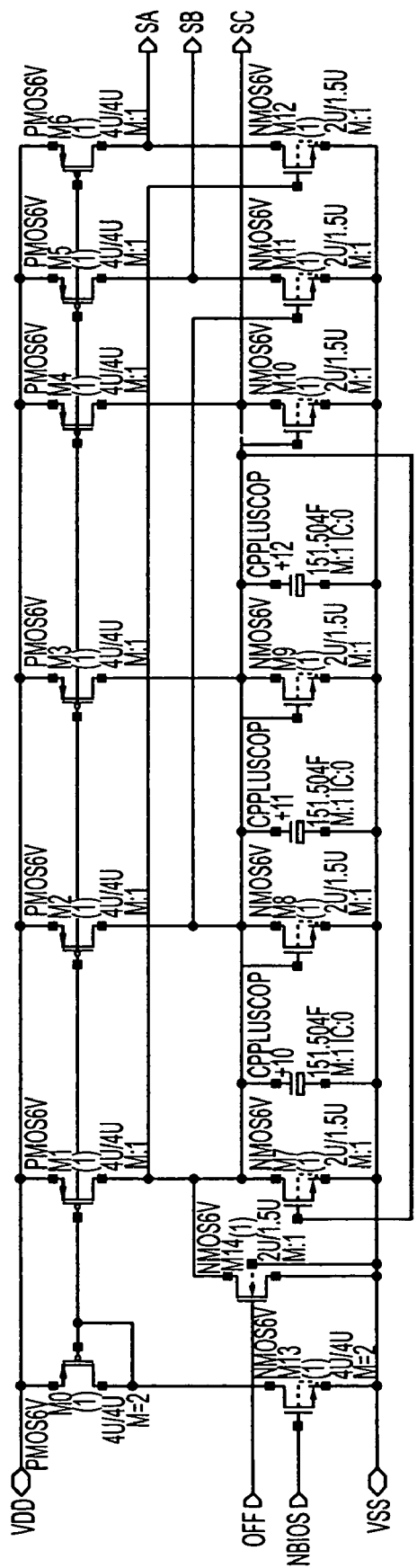
FIG. 6 illustrates details of the oscillator shown in FIG. 4.
Figure 7:
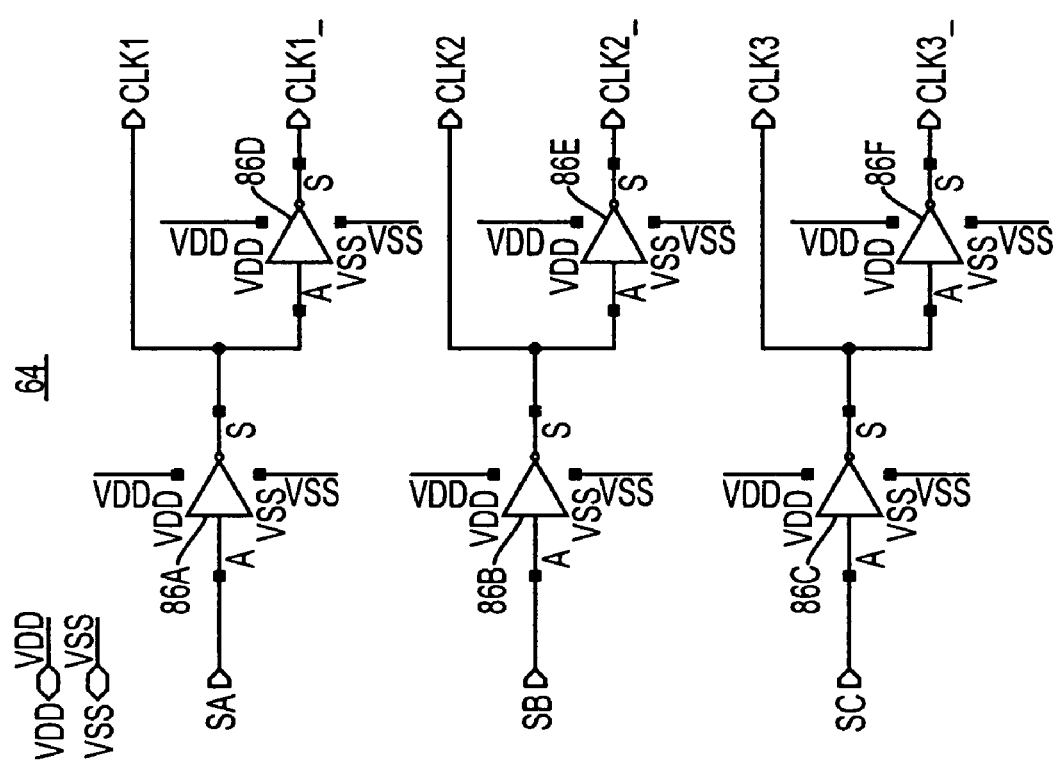
FIG. 7 is a detailed block diagram of the charge pump inverter shown in FIG. 4.
Figure 8:
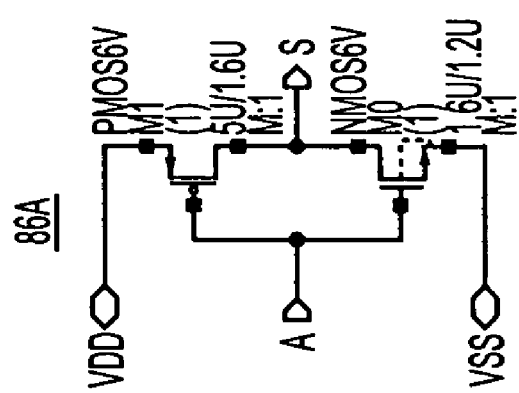
FIG. 8 is a circuit diagram of an individual inverter stage of the charge pump inverter shown in FIG. 7.

FIG. 6 illustrates circuit details for oscillator 62 shown in FIG. 4, while FIGS. 7-8 respectively, are a block diagram of charge pump inverter 64 shown in FIG. 4 including six individual stages 86a-68f, and a schematic circuit diagram of an individual inverter stage 86a. As the implementations shown are preferred only, and are of conventional design, further description has been omitted.

Figure 9:
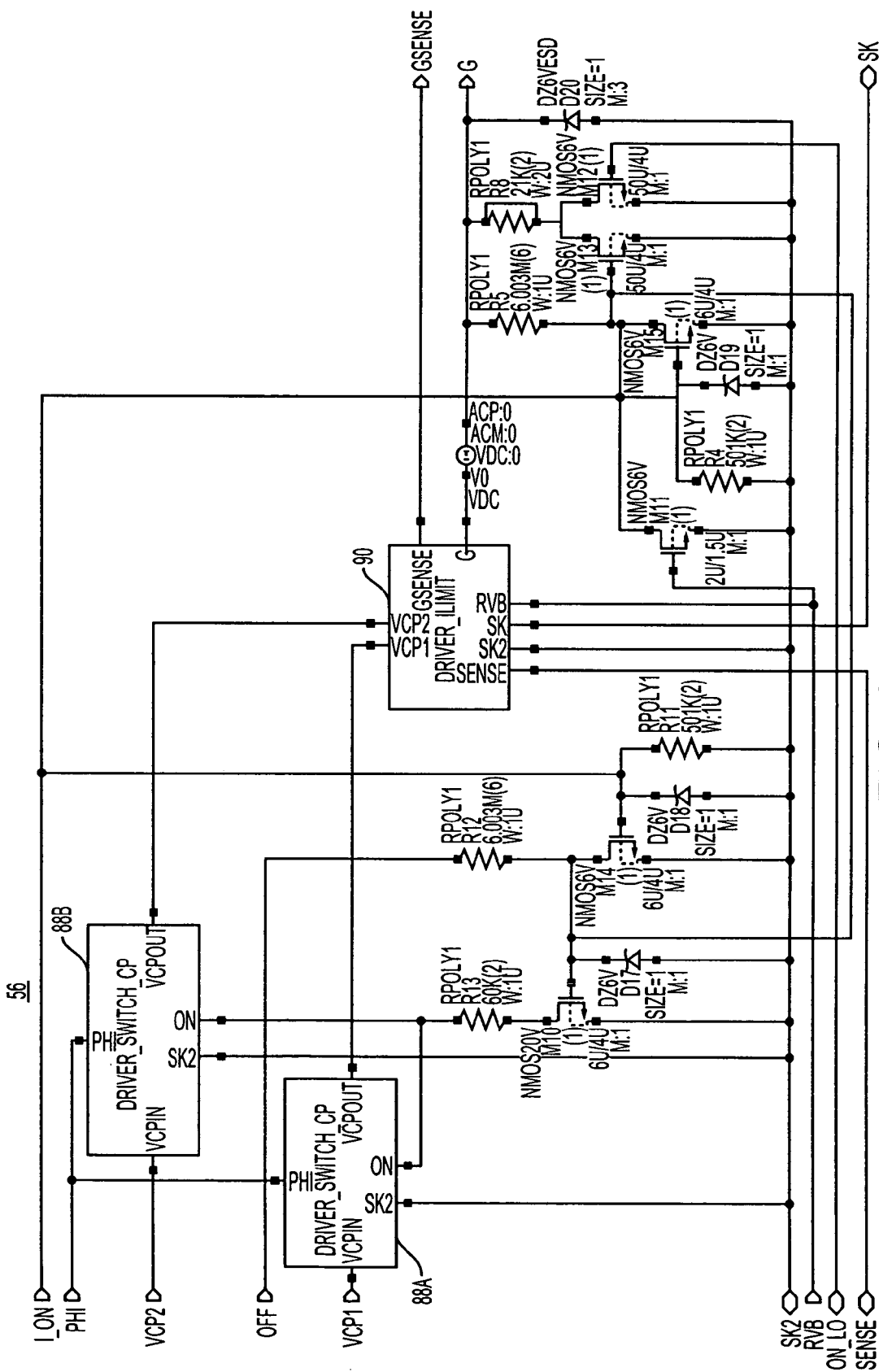
FIG. 9 is a block diagram of the driver linear master shown in FIG. 2.
Figure 10:
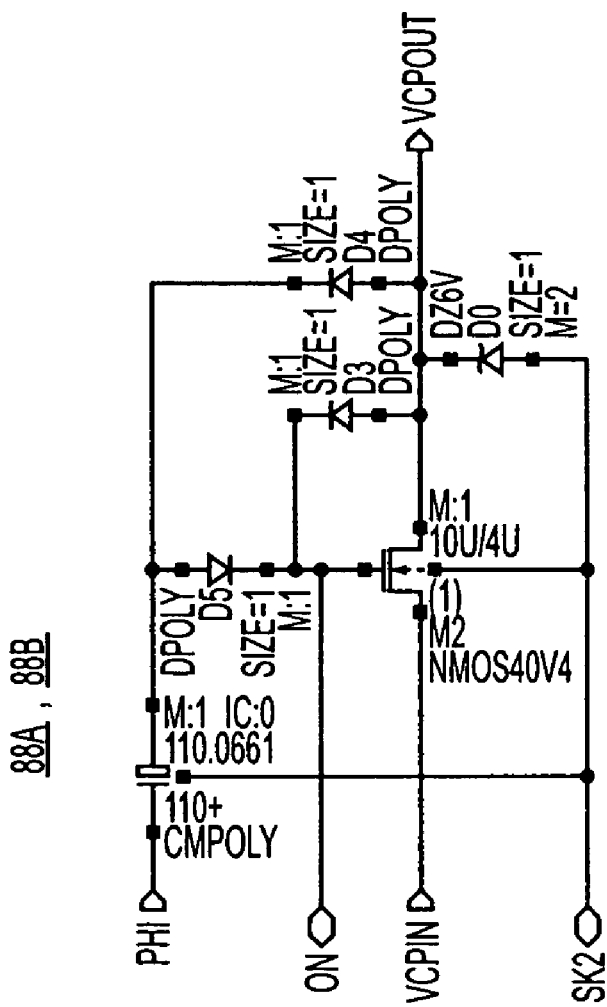
FIG. 10 is a circuit diagram of a driver switch shown in FIG. 9.

FIG. 9 is a block diagram of the driver linear master section 56 shown in FIG. 2. As illustrated, this includes two charge pump switch drivers 88a and 88b coupled respectively to the VCP1 and VCP2 outputs of charge pump section 52, and which transfer the charge pump signals according to the ON and OFF logic signals. A schematic circuit diagram is shown in FIG. 10; this circuit is exemplary only, and may be replaced by any equivalent circuit if desired.

Figure 11:
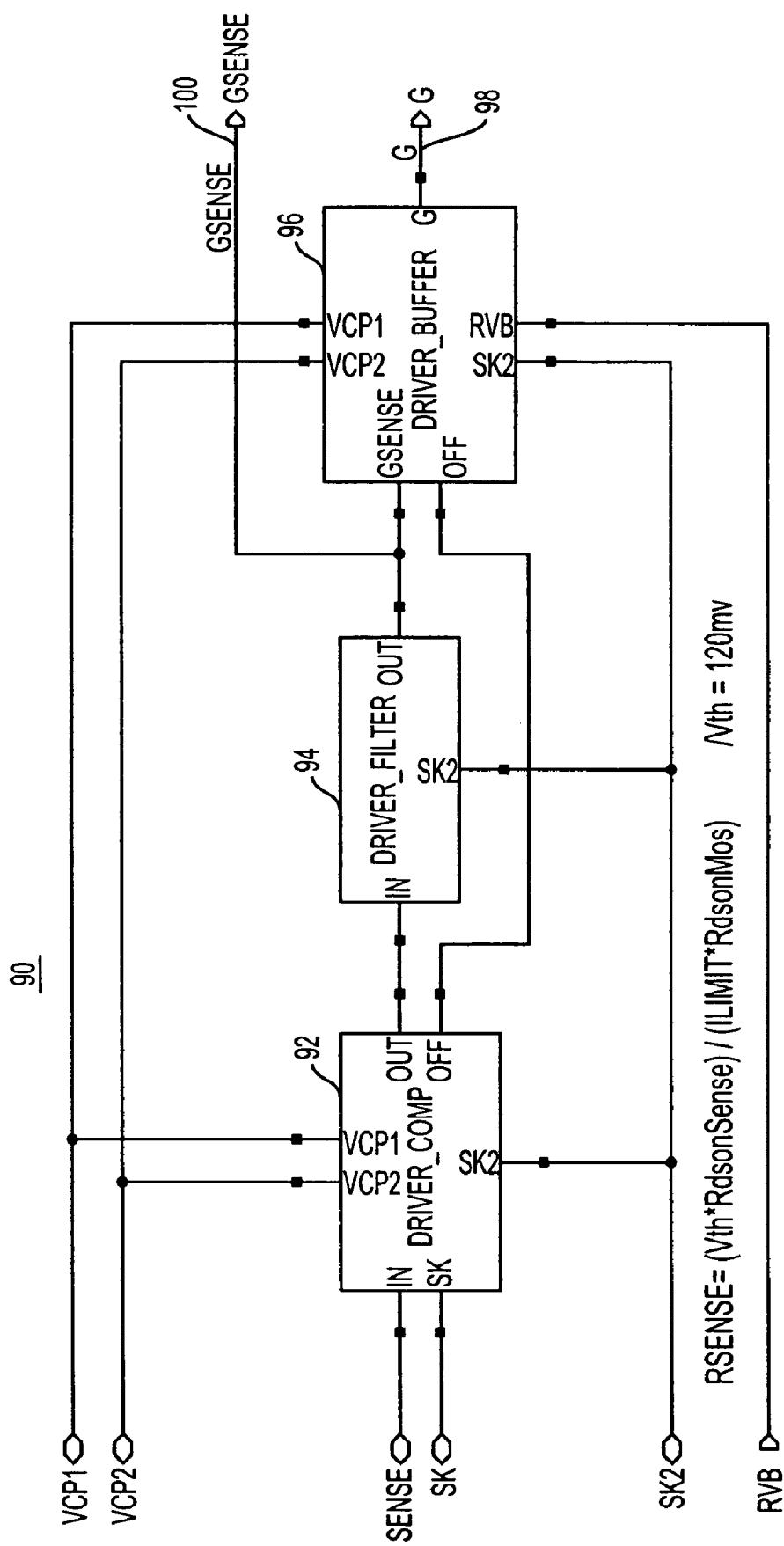
FIG. 11 is a block diagram of the driver limit circuit shown in FIG. 9.

Driver linear master section 56 shown in FIG. 9 also includes a driver-limit circuit 90 which provides the gate drive and current limiting functions, and other needed circuitry for driving the gates of the high side power MOSFET and the high side power MOSFET sensing cell. FIG. 11 shows a block diagram for driver limit circuit 90. This includes a driver-comparator 92, a driver filter 94, and a driver buffer 98. The gate drive signals for the power MOSFET and the sensing MOSFET are provided at terminals 98 and 100, respectively.

Figure 12:
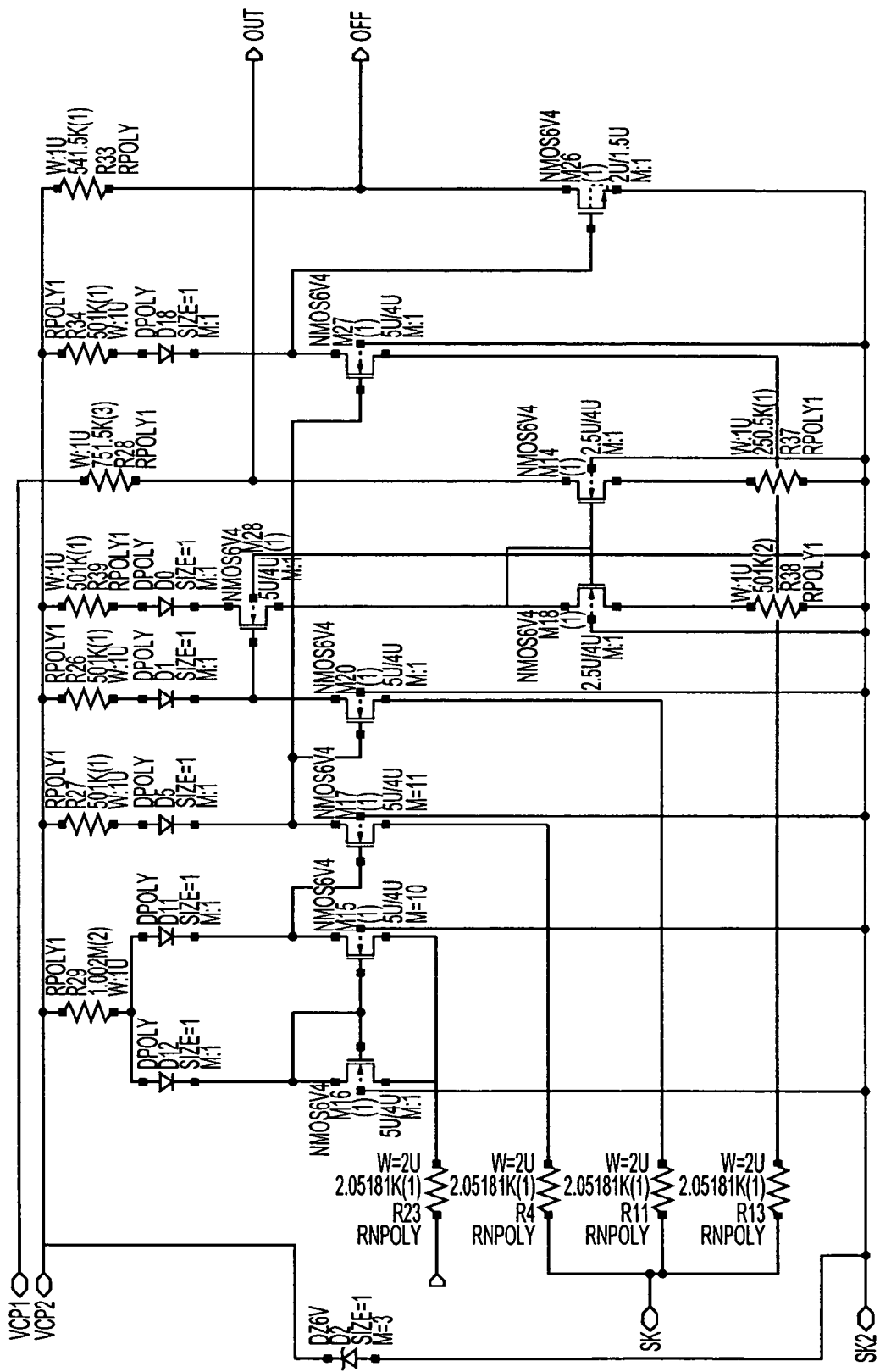
FIG. 12 is a circuit diagram of the comparator of the limit circuit shown in FIG. 11.
Figure 13:
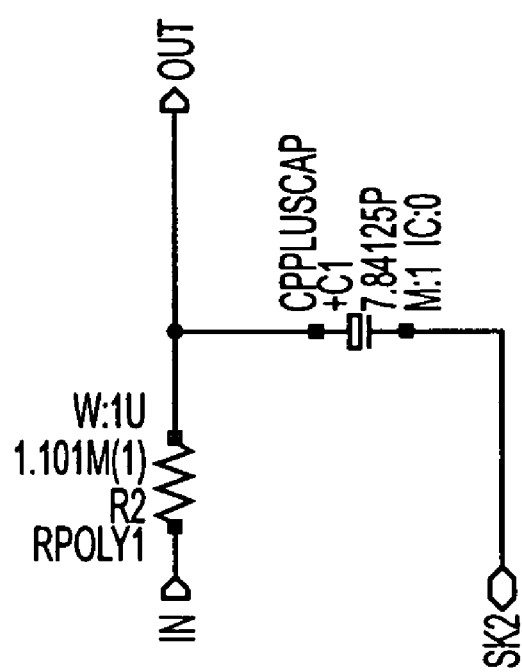
FIG. 13 is a circuit diagram of the driver filter shown in FIG. 11.
Figure 14:
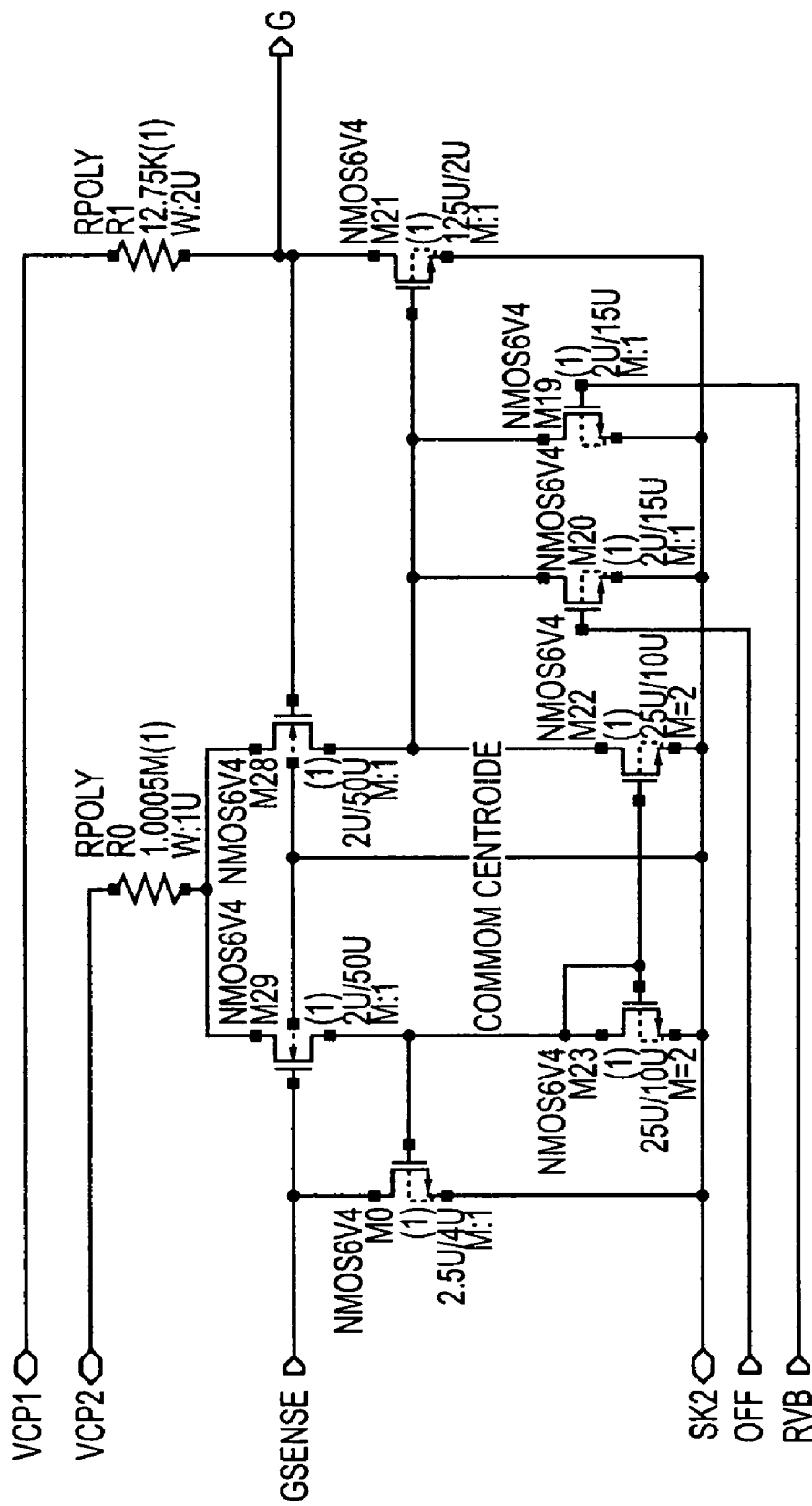
FIG. 14 is a circuit diagram of the driver buffer shown in FIG. 11.

Schematic circuit diagrams for driver-limiter circuit 90 are shown in FIGS. 12-14. FIG. 12 is a circuit diagram for driver-comparator 92, FIG. 13 is a circuit diagram for driver filter 94, and FIG. 14 is a circuit diagram for driver buffer 96. These, too, are conventional and will be readily understood by those skilled in the art. Detailed description is accordingly omitted.

Although the present invention has been described in relation to a particular embodiment thereof, many other variations and modifications and other uses will become apparent to those skilled in the art. It is intended, therefore, that the invention not be limited not by the specific disclosure herein, but that it be given the full scope permitted according to the appended claims.

What is claimed is:

1. A current limiting driver circuit for a semiconductor power switch comprising:
   a sensing circuit for providing a signal representing the current flowing through the semiconductor power switch:
   a source of supply voltage for the power switch and the sensing device;
   a first driver circuit for the power switch;
   a second driver circuit for the sensing circuit;
   a comparator circuit having a first input provided by an output of the sensing circuit, a second input provided by a reference signal, and an output provided as a signal input for the first and second driver circuits; and
   first and second charge pump circuits which receive the same supply voltage as the power switch and the sensing circuit, wherein: the first charge pump circuit provides the supply voltage for the first and second driver circuits; and the second charge pump circuit provides the supply voltage for the comparator circuit.

2. A driver circuit according to claim 1, wherein the power switch is a MOSFET.

3. A driver circuit according to claim 2, wherein: the sensing circuit includes a MOSFET connected in series with a sensing resistor; and the output of the sensing circuit is provided across the sensing resistor.

4. A driver circuit according to claim 1, wherein: the sensing circuit includes a MOSFET connected in series with a sensing resistor; and the output of the sensing circuit is provided across the sensing resistor.

5. A driver circuit according to claim 1, wherein: power switch and the sensing circuit are comprised of a MOSFET device including a MOSFET power carrying cell and a MOSFET sensing cell.

6. A current limiting driver circuit for a semiconductor power switch, the driver circuit comprising:
   a sensing circuit for providing a first signal input representing the current flowing through the semiconductor power switch;
   a first driver circuit for controlling the power switch;
   a second driver circuit for controlling the sensing circuit;
   a comparator circuit for receiving the first signal input provided by the sensing circuit and a reference signal, and providing a second signal input for the first and second driver circuits, such that the first and second driver circuits limit the current through the power switch and the sensing circuit even when the output of the sensing circuit approaches the value of the reference signal; and
   first and second charge pump circuits for receiving a supply voltage, wherein the power switch and the sensing circuit receive the same supply voltages,
   wherein the first charge pump circuit provides the supply voltage for the first and second driver circuits and the second charge pump circuit provides the supply voltage for the comparator circuit.

7. A driver circuit according to claim 6, wherein the supply voltage for the comparator circuit is higher than the supply voltage for the power switch and the sensing device.

8. A driver circuit according to claim 6, wherein the supply voltage for the current limiting circuit sufficiently exceeds the supply voltage for the MOSFETS to ensure that currently limiting is provided even for small values of the drain-source voltage across the MOSFETS in the ON state.

9. A semiconductor switch device comprising:
- a MOSFET device including a MOSFET power carrying cell and a MOSFET current sensing cell;
- a sensing element connected to the sensing cell to provide an output signal representative of the current in the power carrying cell;
- a common supply voltage for the MOSFET device;
- a first driver circuit for the power carrying cell;
- a second driver circuit for the sensing cell;
- a comparator circuit having a first input provided by the sensing cell output signal, a second input provided by a reference signal, and an output provided as a signal input for the first and second driver circuits; and
- first and second charge pump circuits connected to the common supply voltage; wherein: the first charge pump circuit provides the supply voltage for the first and second driver circuits; and the second charge pump circuit provides the supply voltage for the comparator circuit.

10. A semiconductor switch device according to claim 9, wherein the supply voltage for the comparator circuit is higher than the common supply voltage.

11. A semiconductor switch device according to claim 9, wherein the supply voltage for the current limiting circuit sufficiently exceeds the supply voltage for the MOSFETS to ensure that currently limiting is provided even for small values of the drain-source voltage across the MOSFETS in the ON state.

* * * * *